(12) United States Patent
Ogaki

(10) Patent No.: US 12,469,895 B2
(45) Date of Patent: Nov. 11, 2025

(54) HEATING ELEMENT COOLING MECHANISM

(71) Applicant: HONDA MOTOR CO., LTD., Tokyo (JP)

(72) Inventor: Toru Ogaki, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 1123 days.

(21) Appl. No.: 17/403,209

(22) Filed: Aug. 16, 2021

(65) Prior Publication Data

US 2022/0069374 A1 Mar. 3, 2022

(30) Foreign Application Priority Data

Aug. 27, 2020 (JP) ................................. 2020-143964

(51) Int. Cl.
| | | |
|---|---|---|
| *H01M 10/613* | (2014.01) | |
| *H01L 23/40* | (2006.01) | |
| *H01M 10/625* | (2014.01) | |
| *H05K 7/14* | (2006.01) | |
| *H05K 7/20* | (2006.01) | |

(52) U.S. Cl.
CPC ....... *H01M 10/613* (2015.04); *H01M 10/625* (2015.04); *H05K 7/14* (2013.01); *H05K 7/20263* (2013.01); *H01L 23/4006* (2013.01)

(58) Field of Classification Search
CPC ..... H01L 23/4006; H01M 10/613; H05K 7/14
See application file for complete search history.

(56) References Cited

U.S. PATENT DOCUMENTS

| | | | |
|---|---|---|---|
| 2004/0042175 A1 | 3/2004 | Kehret et al. | |
| 2010/0053897 A1 | 3/2010 | Kusaka et al. | |
| 2011/0304979 A1* | 12/2011 | Peterson | H01L 23/473 |
| | | | 361/702 |
| 2013/0189557 A1* | 7/2013 | Haussmann | H01M 10/6569 |
| | | | 165/104.11 |
| 2013/0189558 A1* | 7/2013 | Haussmann | H01M 10/658 |
| | | | 429/120 |

(Continued)

FOREIGN PATENT DOCUMENTS

| | | | | |
|---|---|---|---|---|
| CN | 105027405 A | | 11/2015 | |
| CN | 109690812 A | * | 4/2019 | .......... H01M 10/425 |

(Continued)

OTHER PUBLICATIONS

Translation of CN109690812A named Translation—CN109690812A (Year: 2019).*

(Continued)

*Primary Examiner* — Paul Alvare
(74) *Attorney, Agent, or Firm* — Paratus Law Group, PLLC

(57) ABSTRACT

A heating element cooling mechanism includes a heating element, a support section that supports the heating element, and a cooling section configured to perform heat exchange with the heating element, in which the heating element is supported by the support section in direct contact, the cooling section is supported by the support section by biasing, and a heat transfer member is disposed between the heating element and the cooling section, and the heating element and the cooling section are not in direct contact with each other.

16 Claims, 5 Drawing Sheets

(56) References Cited

U.S. PATENT DOCUMENTS

| | | | |
|---|---|---|---|
| 2013/0269920 A1 | 10/2013 | Taketomi et al. | |
| 2014/0342202 A1* | 11/2014 | Chang | H01M 10/613 |
| | | | 429/71 |
| 2016/0284623 A1 | 9/2016 | Mitsui | |
| 2018/0005921 A1* | 1/2018 | Takemura | H05K 7/20254 |
| 2019/0181516 A1 | 6/2019 | Seki et al. | |
| 2020/0358127 A1 | 11/2020 | Terauchi et al. | |
| 2021/0091429 A1 | 3/2021 | Seki et al. | |
| 2021/0218046 A1* | 7/2021 | Seno | H01M 8/2428 |
| 2023/0163324 A1* | 5/2023 | Uchibayashi | H01M 8/2475 |
| | | | 429/456 |

FOREIGN PATENT DOCUMENTS

| | | | | |
|---|---|---|---|---|
| DE | 102009058809 A1 * | 6/2011 | | B60L 11/1874 |
| JP | 2000-120598 A | 4/2000 | | |
| JP | 3051745 B1 | 6/2000 | | |
| JP | 2007-131187 A | 5/2007 | | |
| JP | 2010-055310 A | 3/2010 | | |
| JP | 2016-184658 A | 10/2016 | | |
| JP | 2018-006526 A | 1/2018 | | |
| JP | 2018-032579 A | 3/2018 | | |
| JP | 2019-106283 A | 6/2019 | | |
| WO | WO 2019/146238 A1 | 8/2019 | | |

OTHER PUBLICATIONS

Translation of DE102009058809A1 named Translation—DE102009058809A1 (Year: 2011).*

Dec. 5, 2023, translation of Japanese Office Action issued for related JP Application No. 2020-143964.

Jul. 29, 2024, Translation of Chinese Office Action issued for related CN Application No. 202110911126.4.

* cited by examiner

HEATING ELEMENT COOLING MECHANISM

CROSS-REFERENCE TO RELATED APPLICATIONS

The present application claims the benefit of priority of Japanese Patent Application No. 2020-143964, filed on Aug. 27, 2020, the content of which is incorporated herein by reference.

TECHNICAL FIELD

The present invention relates to a heating element cooling mechanism.

BACKGROUND ART

There has been a heating element cooling mechanism including a heating element and a cooling section that performs heat exchange with the heating element. For example, JP-A-2019-106283 describes that a battery module serving as a heating element is cooled by a water jacket serving as a cooling section.

However, in this type of heating element cooling mechanism, when vibration of the heating element is directly transmitted to the cooling section, the cooling section may be damaged.

SUMMARY OF INVENTION

The present environment provides a heating element cooling mechanism capable of preventing damage to a cooling section caused by vibration of a heating element.

The present environment provides a heating element cooling mechanism comprising:
  a heating element;
  a support section that supports the heating element; and
  a cooling section configured to perform heat exchange with the heating element, wherein
  the heating element is supported by the support section in direct contact,
  the cooling section is supported by the support section by biasing, and
  a heat transfer member is disposed between the heating element and the cooling section, and the heating element and the cooling section are not in direct contact with each other.

According to the present environment, it is possible to prevent damage to a cooling section caused by vibration of a heating element.

DESCRIPTION OF EMBODIMENTS

Figure 1:
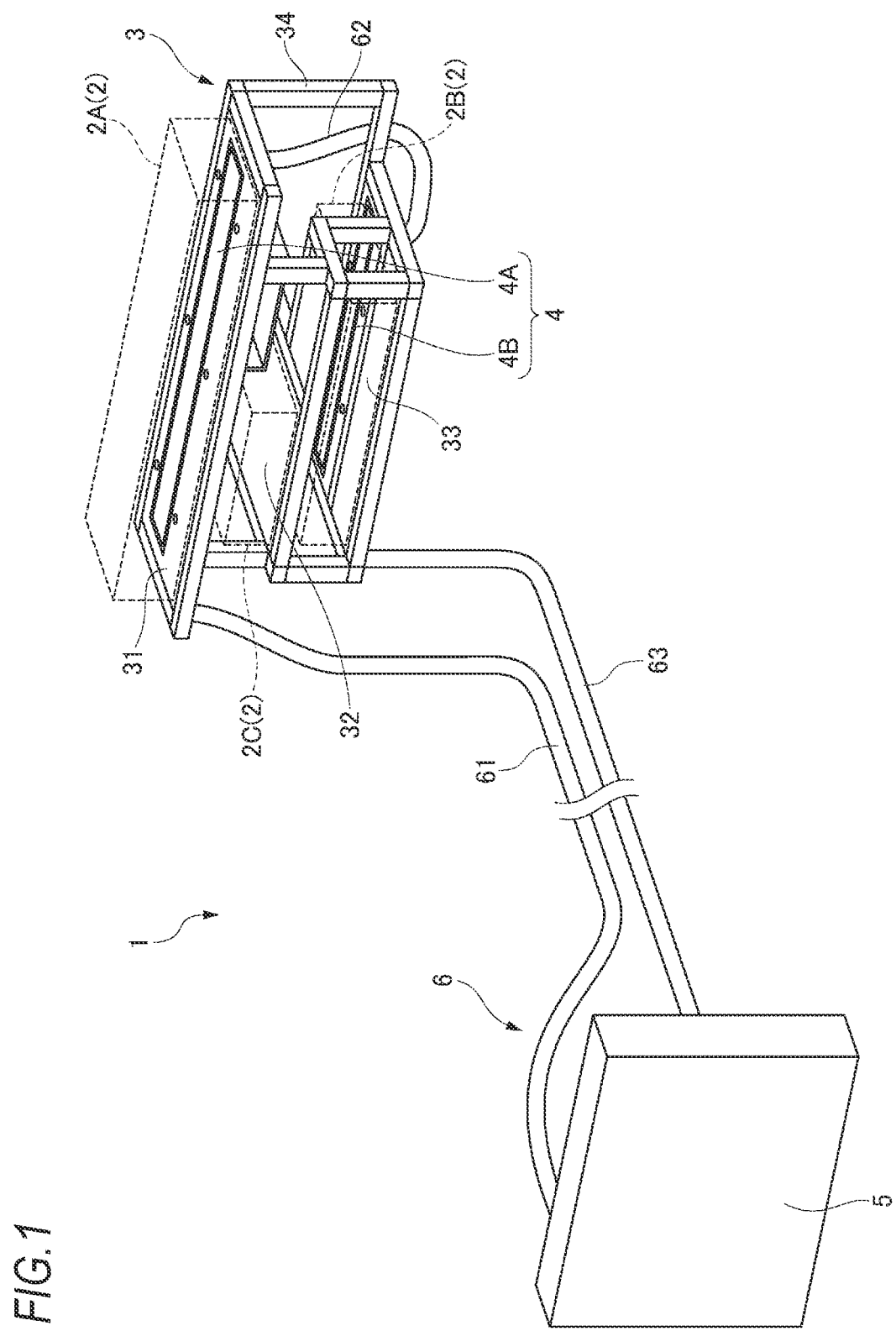
FIG. 1 is a perspective view showing a heating element cooling mechanism according to an embodiment of the present invention.

Hereinafter, an embodiment of the present invention will be described with reference to FIGS. 1 to 4. The drawings are viewed in directions of reference numerals.

Heating Element Cooling Mechanism

Figure 2:
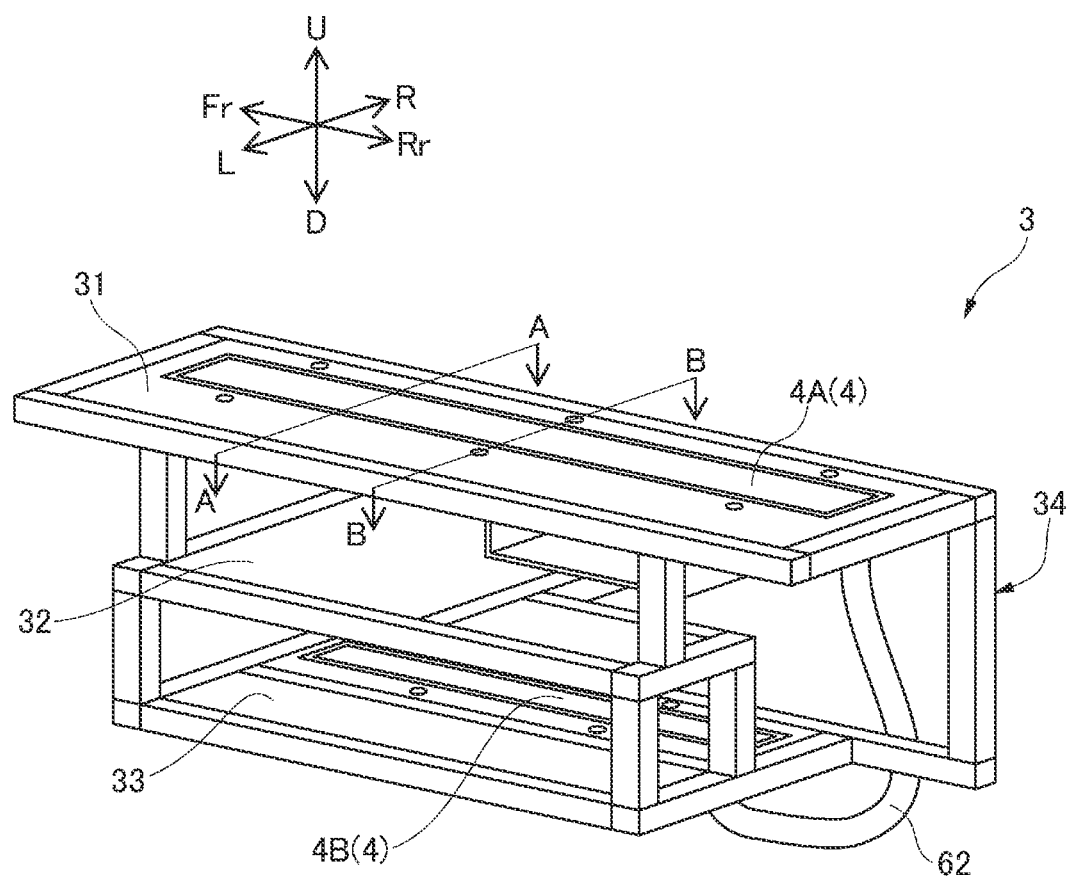
FIG. 2 is a perspective view showing a support section and a cooling section of the heating element cooling mechanism shown in FIG. 1.

As shown in FIGS. 1 and 2, a heating element cooling mechanism 1 according to an embodiment of the present invention includes: a heating element 2; a support section 3 that supports the heating element 2; a cooling section 4 that performs heat exchange with the heating element 2; and a liquid medium circulation path 6 that circulates a liquid medium between the cooling section 4 and a radiator 5. The heating element cooling mechanism 1 may be mounted on, for example, a transport device such as: a vehicle such as an engine automobile, a hybrid automobile, a fuel cell vehicle, and an electric automobile; a ship; and an aircraft.

Heating Element

As shown in FIG. 1, the heating element 2 of the present embodiment includes a first heating element 2A, a second heating element 2B, and a third heating element 2C, which have rectangular parallelepiped box shapes having different sizes. The first heating element 2A, the second heating element 2B, and the third heating element 2C are, for example, a battery, a battery control apparatus that controls the battery, and an autonomous driving device that realizes autonomous driving of the vehicle.

Support Section

The support section 3 includes a plurality of shelves 31 to 33 arranged in parallel at predetermined intervals in an upper-lower direction, and a frame 34 that supports the shelves 31 to 33. The support section 3 of the present embodiment includes three stages of shelves 31 to 33. The first heating element 2A is disposed on an upper surface of a shelf 31 of an upper stage, the second heating element 2B is disposed on an upper surface of a shelf 33 of a lower stage, and the third heating element 2C is disposed on a shelf 32 of a middle stage.

The shelves 31 and 33 are made of a material having a lower thermal conductivity than that of the cooling section 4. In this way, heat of the heating element 2 can be actively transferred to the cooling section 4, and efficient heat exchange can be performed between the heating element 2 and the cooling section 4.

Cooling Section

The cooling section 4 is a plate-shaped liquid cooling device formed by, for example, extrusion molding using a metal having a high thermal conductivity as a material. A plurality of water jackets 42 through which the liquid medium passes are formed in parallel inside the plate-shaped cooling section body 41 (see FIGS. 3 and 4). The cooling section 4 of the present embodiment includes a first cooling section 4A that is disposed on the shelf 31 of the upper stage and cools the first heating element 2A by heat exchange, and a second cooling section 4B that is disposed on the shelf 33 of the lower stage and cools the second heating element 2B by heat exchange. In the present embodiment, the third heating element 2C arranged on the shelf 32 of the middle stage is assumed to be a device that does not require cooling, and no cooling section 4 is arranged on the shelf 32 of the middle stage, but a cooling section 4 may also be arranged on the shelf 32 of the middle stage.

A heat generation amount of the first heating element 2A arranged on the shelf 31 of the upper stage is smaller than a heat generation amount of the second heating element 2B arranged on the shelf 33 of the lower stage. According to such an arrangement configuration, even when the heat of the second healing element 2B disposed on the shelf 33 of the lower stage rises and acts on the first heating element 2A, since the heat generation amount of the first heating element 2A is small, adverse effects on the first heating element 2A can be prevented.

Liquid Medium Circulation Path

As shown in FIG. 1, the liquid medium circulation path 6 includes a first cooling pipe 61 that supplies the liquid medium discharged from the radiator 5 to one end of the first cooling section 4A, a second cooling pipe 62 that supplies the liquid medium discharged from the other end of the first cooling section 4A to the other end side of the second cooling section 4B, and a third cooling pipe 63 that returns the liquid medium discharged from one end side of the second cooling section 4B to the radiator 5.

Connection Structure for Heating Element and Support Section

The heating elements 2A, 2B, and 2C are placed respectively in direct contact with the shelves 31 to 33 of the support section 3, and are respectively fixed to the shelves 31 to 33 via a predetermined fixture (not shown).

Connection Structure for Heating Element and Cooling Section

Figure 3:
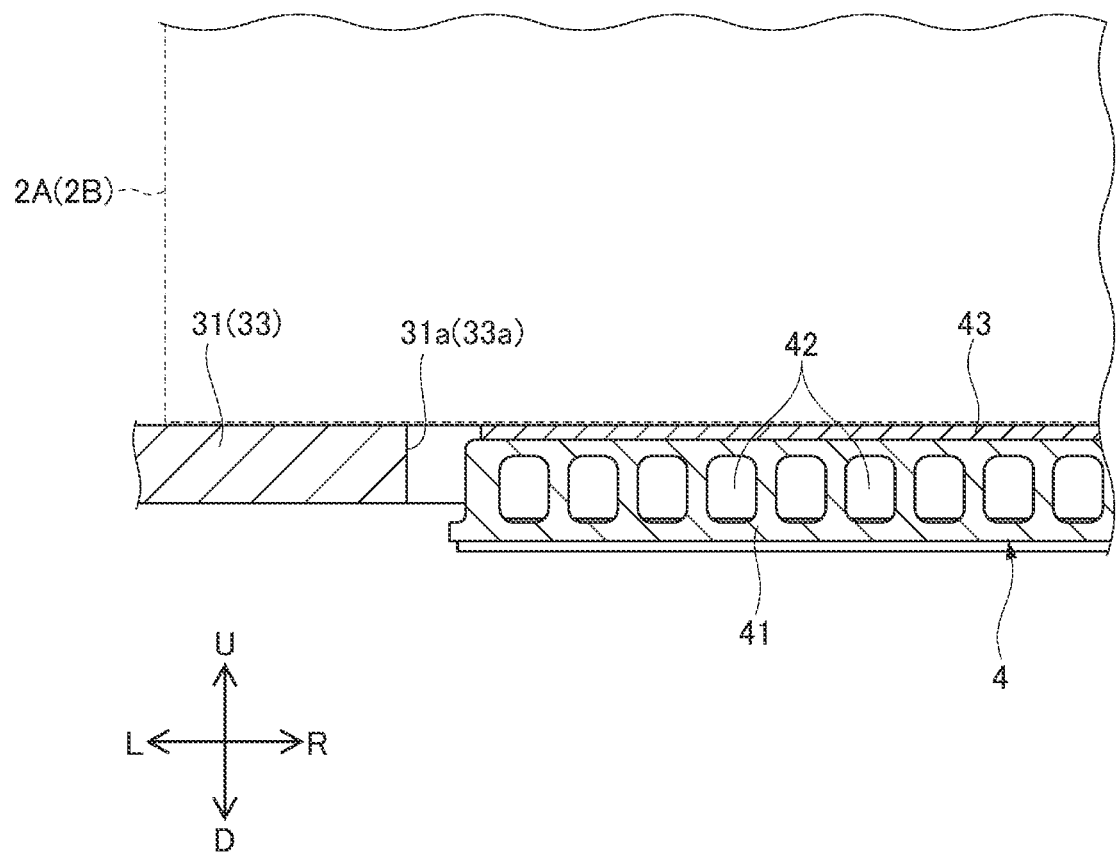
FIG. 3 is a cross-sectional view taken along a line A-A of FIG. 2.
Figure 4:
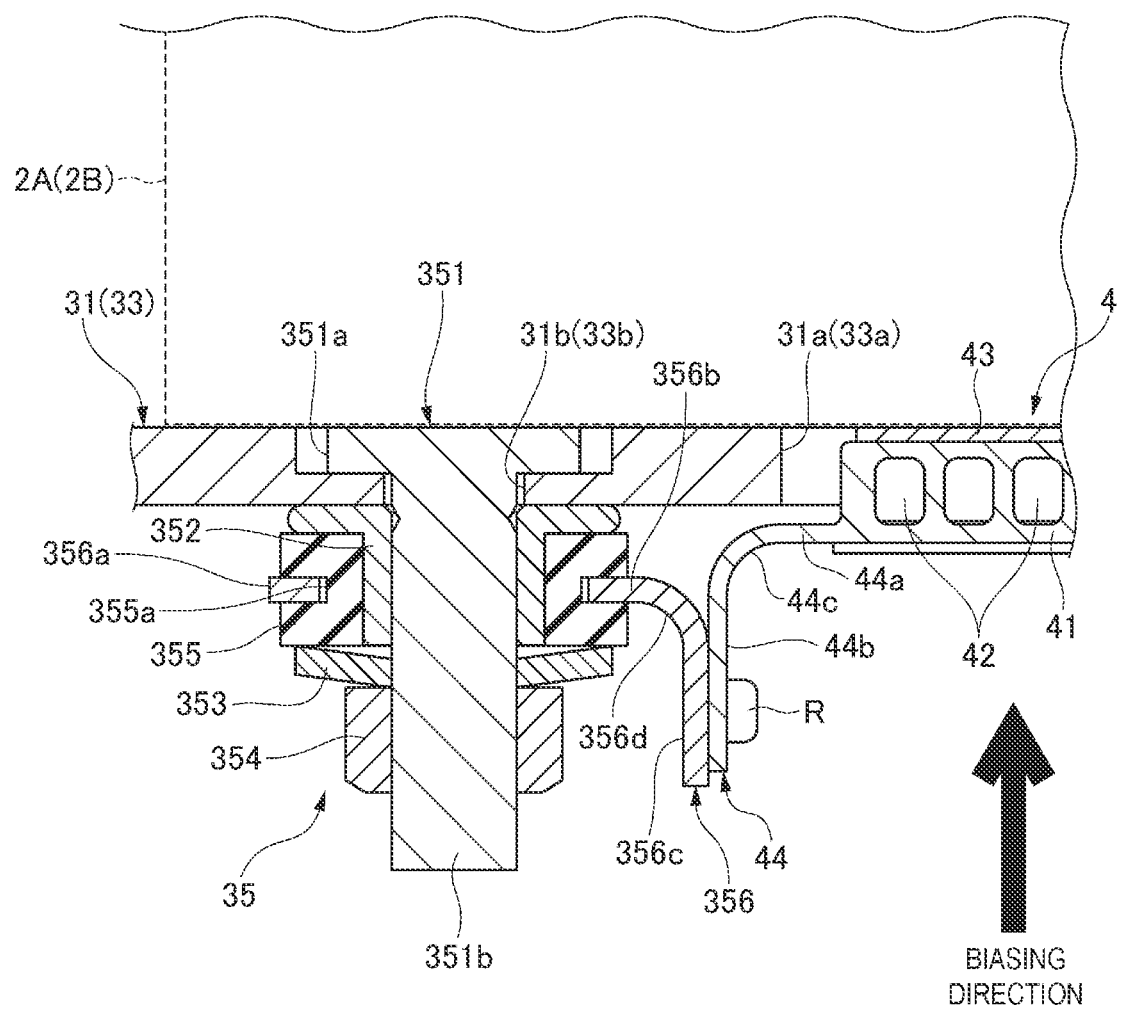
FIG. 4 is a cross-sectional view taken along a line B-B of FIG. 2.
Figure 4:
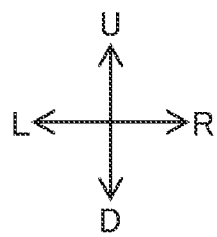

As shown in FIGS. 3 and 4, the first cooling section 4A and the second cooling section 4B are arranged in cooling section arrangement holes 31a, 33a formed in a manner penetrating the shelves 31, 33 in the upper-lower direction, and are connected to and supported by the shelves 31, 33 in a state of being biased in the upper-lower direction. A connection structure between the first cooling section 4A and the second cooling section 4B and the shelves 31 and 33 will be described later.

A heat transfer member 43 is disposed on an upper surface of each of the first cooling section 4A and the second cooling section 4B. The heat transfer member 43 is, for example, a material having a high thermal conductivity. As a result, the upper surfaces of the first cooling section 4A and the second cooling section 4B, which are biased upward, are in contact with lower surfaces of the first heating element 2A and the second heating element 2B via the heat transfer members 43. According to the connection structure between the heating element 2 and the cooling section 4, the heat transfer member 43 is disposed between the heating element 2 and the cooling section 4, and the heating element 2 and the cooling section 4 are not in direct contact with each other. Therefore, vibration of the heating element 2 is not directly transmitted to the cooling section 4, and damage to the cooling section 4 can be prevented. Furthermore, by providing the heat transfer member 43 with a buffering function (elasticity), damage to the cooling section 4 due to the vibration of the heating element 2 can be prevented.

It is preferable that the first heating element 2A and the second heating element 2B are supported by the shelf sections 31 and 33, and a load of the first heating element 2A and the second heating element 2B do not act on the first cooling section 4A and the second cooling section 4B in a stationary state. When the first heating element 2A and the second heating element 2B are separated from the first cooling section 4A and the second cooling section 4B so that the load of the first heating element 2A and the second heating element 2B does not act, the cooling efficiency by the first cooling section 4A and the second cooling section 4B is deteriorated. However, by interposing the heat transfer members 43 therebetween so that the heat transfer members 43 are in contact with the first cooling section 4A and the second cooling section 4B and the heat transfer members 43 are in contact with the first heating element 2A and the second heating element 2B, heat transfer is enabled between the first heating element 2A, the second heating element 2B and the first cooling section 4A, the second cooling section 4B.

Connecting Structure Between Support Section and Cooling Section

For convenience, the following description is made defining the upper-lower direction, the left-right direction, and the front-rear direction as illustrated in FIGS. 2 to 4, but these directions are irrelevant to directions of the transport device or the like in which the heating element cooling mechanism 1 is mounted. In the drawings, a front side is indicated as Fr, a rear side as Rr, a right side as R, a left side as L, an upper side as U, and a lower side as D.

The support section 3 includes a plurality of cooling section connection mechanisms 35 as a configuration for connecting the cooling section 4. Each of the cooling section connection mechanisms 35 includes a bolt 351, a collar 352, a washer 353, a nut 354, a rubber mount 355, and a first extending portion 356. The cooling section 4 includes a plurality of second extending portions 44 extending in the left-right direction from both side portions of the cooling section body 41 as a configuration for connection to the support section 3. The plurality of second extending portions 44 are connected to the support section 3 respectively via the cooling section connection mechanisms 35.

The bolts 351 are inserted from above into the counterbore holes 31b and 33b firmed in the shelves 31 and 33. Each of the bolts 351 is prevented from coming off downward by a head 351a, engaging with a peripheral edge portion of the counterbore holes 31b and 33b, and has a shaft 351b extending downward from the shelves 31 and 33. Since the head 351a of the bolt 351 is positioned below the upper surfaces of the shelves 31 and 33 due to the counterbore holes 31b and 33b, the load of the first heating element 2A and the second heating element 2B uniformly acts on the shelves 31 and 33. An outer peripheral portion of the shaft 351b of the bolt 351 is mounted with the collar 352 and the washer 353, and is retained by the nut 354.

The rubber mount 355 is a ring-shaped buffer member, is mounted on an outer peripheral portion of the collar 352, and is restricted from coming off downward by the washer 353 and the nut 354. The rubber mount 355 has an annular groove 355a in an outer peripheral portion thereof, and an annular portion 356a of the first extending portion 356 is fitted into the groove 355a.

The first extending portion 356 includes: the annular portion 356a fitted into the groove 355a of the rubber mount 355; a first extension base 356b extending from the annular portion 356a toward a second extending portion 44 of the cooling section 4 in the left-right direction; a first downward extending portion 356c extending downward, which is a direction away from the cooling section body 41 of the cooling section 4 in the upper-lower direction; and a first bent portion 356d connecting the first extension base 356b and the first downward extending portion 356c.

The second extending portion 44 includes: a second extension base 44a extending from the first extending portion 356 toward the first extending portion 356; a second downward extending portion 44b extending downward, which is the direction away from the cooling section body 41 of the cooling section 4 in the upper-lower direction; and a second bent portion 44c connecting the second extension base 44a and the second downward extending portion 44b.

The first downward extending portion 356c and the second downward extending portion 44b of the first extending portion 356 and the second extending portion 44 are connected to each other via a rivet R.

According to such a configuration, the cooling section 4 is supported by the support section 3 by biasing in the upper-lower direction via the rubber mount 355 which functions as a buffer member. Accordingly, even when the heating element 2 vibrates and the load of the heating element acts on the cooling section 4, since the cooling section 4 is supported by the support section 3 by biasing in the upper-lower direction, the load of the heating element 2 due to the vibration can be released.

Further, since the support section 3 supports the cooling section 4 via the rubber mount 355 which functions as a buffer member, it is possible to prevent damage occurring between the cooling section 4 and the support section 3 due to the vibration of the cooling section 4. Further, since the rubber mount 355 is provided in the cooling section connection mechanism 35 on the support section 3 side, it is not necessary to perform special processing on the cooling section 4 side.

The first extending portion 356 is attached to the bolt 351 via the rubber mount 355. The shelves 31 and 33 supporting the heating element 2 and the bolt 351 to which the first extending portion 356 is attached are separate members, and thus are easy to assemble.

Further, the downward extending portions 356c, 44b extending in the upper-lower direction, which is the biasing direction of the cooling section 4, are connected to each other, so that bending of the connecting portion can be prevented. Further, in the bent portions 356d and 44c of the first extending portion 356 and the second extending portion 44, the load is input not in a direction in which the bent portions 356d and 44c bent from the linear shape are returned to the linear shape but in a direction in which the bent portions 356d and 44c are further bent. That is, the load of the heating element 2 is input to the bent portions 356d and 44c in a direction resistant to deformation. Therefore, durability of the first extending portion 356 and the second extending portion 44 is improved.

Other Arrangement Examples of Cooling Section

Figure 5:
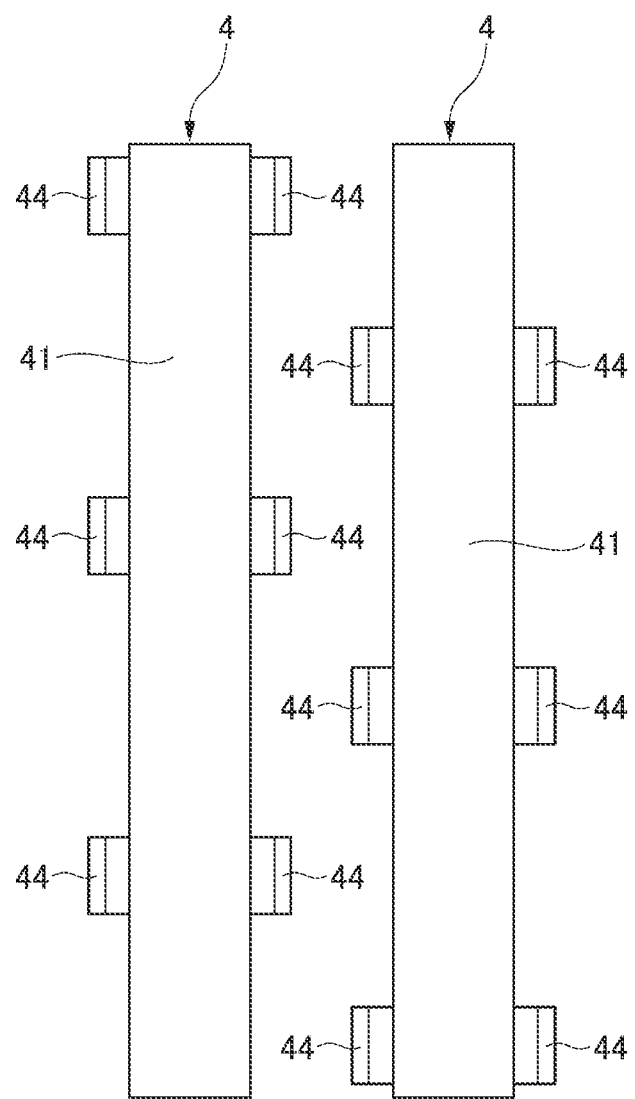
FIG. 5 is a plan view illustrating another arrangement example of the cooling section.

As shown in FIG. 5, cooling sections 4 can be arranged in parallel to the left and right of each other. At this time, it is desirable that the plurality of the second extending portions 44 are arranged such that when one of the cooling sections 4 is rotated by 180° with respect to the other cooling section 4 in the same plane, the second extending portion 44 of the one cooling section 4 and the second extending portion 44 of the other cooling section 4 do not interfere with each other. According to such an arrangement configuration of the second extending portions 44, even if the cooling sections 4 having the same configuration are disposed to the left and right of each other, interference between the second extending portions 44 of the cooling sections 4 is prevented, so that it is possible to arrange the two cooling sections 4 close to each other.

Although the embodiments are described above with reference to the drawings, it is needless to say that the present invention is not limited to such examples. It will be apparent to those skilled in the art that various changes and modifications may be conceived within the scope of the claims. It is also understood that the various changes and modifications belong to the technical scope of the present invention. Components in the embodiments described above may be combined freely within a range not departing from the spirit of the invention.

In the present specification, at least the following matters are described. Although corresponding components or the like in the above embodiment are shown in parentheses, the present disclosure is not limited thereto.

(1) A heating element cooling mechanism (heating element cooling mechanism 1) including:
 a heating element (heating element 2);
 a support section (support section 3) that supports the heating element; and
 a cooling section (cooling section 4) configured to perform heat exchange with the heating element, in which
 the heating element is supported by the support section in direct contact,
 the cooling section is supported by the support section by biasing, and
 a heat transfer member (heat transfer member 43) is disposed between the heating element and the cooling section, and the heating element and the cooling section are not in direct contact with each other.

According to (1), the heating element and the cooling section are not in direct contact with each other and the heating element and the cooling section are connected to each other through the heat transfer member. Therefore, the vibration of the heating element is not directly transmitted to the cooling section, and damage to the cooling section can be prevented. Furthermore, by providing the heat transfer member with a buffering function, damage to the cooling section due to the vibration of the heating element can be prevented.

(2) The heating element cooling mechanism according to (1), in which
 the support section supports the cooling section via a buffer member (rubber mount 355).

According to (2), since the support section supports the cooling section via the buffer member, it is possible to prevent damage occurring between the cooling section and the support section due to the vibration of the cooling section.

(3) The heating element cooling mechanism according to (1) or (2), in which
 the support section includes a first extending portion (first extending portion 356) extending in a direction parallel to a biasing direction for biasing the cooling section,
 the cooling section includes at least one second extending portion (second extending portion 44) extending in a direction parallel to the biasing direction, and
 the first extending portion and the second extending portion are connected to each other.

According to (3), the extending portions extending in the biasing direction are connected to each other, so that the bending of the connecting portion can be prevented.

(4) The heating element cooling mechanism according to (3), in which
 the first extending portion and the second extending portion respectively include:
 extension bases (first extension base 356b, second extension base 44a) extending in directions toward each other;
 extension ends (first downward extending portion 356c, second downward extending portion 44b) extending in a direction away from the cooling section in the biasing direction; and
 bent portions (first bent portion 356d, second bent portion 44c) respectively connecting the extension bases and the extension ends, and
 the extension ends are connected to each other.

According to (4), in the bent portions of the first extending portion and the second extending portion, load due to vibration of the cooling section is input not in a direction in which the bent portions bent from the linear shape are returned to the linear shape but in a direction in which the bent portions are further bent. That is, the load of the heating element is input to the bent portions in a direction resistant to deformation with respect, so that durability of the first extending portion and the second extending portion is improved.

(5) The heating element cooling mechanism according to (3) or (4), in which
the support section includes:
a shelf (shelves 31, 33) that supports the heating element, and
the first extending portion extending from the shelf, and supports the cooling section via a buffer member, and
the buffer member is disposed between the shelf and the first extending portion.

According to (5), since the buffer member is disposed not on the cooling section side but on the support section side, it is not necessary to perform special processing on the cooling section.

(6) The heating element cooling mechanism according to (5), in which
the shelf is provided with a rod-shaped member (bolt 351) extending in the biasing direction, and
the first extending portion is attached to the rod-shaped member via the buffer member.

According to (6), the shelf supporting the heating element and the rod-shaped member to which the first extending portion is attached are separate members, and thus are easy to assemble.

(7) The heating element cooling mechanism according to any one of (1) to (6), in which
the support section has a lower thermal conductivity than that of the cooling section.

According to (7), it is possible to actively transfer heat from the heating element to the cooling section.

(8) The heating element cooling mechanism according to any one of (1) to (7), in which
the cooling section is a liquid cooling device configured to cool the heating element via a liquid medium.

According to (8), since the cooling section is a liquid cooling device that performs cooling with the liquid medium, damage to the cooling section, such as refrigerant leakage, can be prevented by the heating element and the cooling section not being in direct contact with each other.

(9) The heating element cooling mechanism according to any one of (1) to (8), in which
the support section includes at least two stages of shelves (shelves 31, 33) in an upper-lower direction,
the heating element includes a first heating element (first heating element 2A) supported by a shelf of an upper stage (shelf 31) among the two stages of shelves and a second heating element (second heating element 2B) supported by a shelf of a lower stage (shelf 33), and
a heat generation amount of the first heating element is smaller than a heat generation amount of the second heating element.

According to (9), even when the heat of the second heating element disposed on the shelf of the lower stage rises and acts on the first heating element, since the heat generation amount of the first heating element is small, adverse effects on the first heating element can be prevented.

(10) The heating element cooling mechanism according to any one of (3) to (6), in which
the cooling section includes a cooling section body (cooling section body 41),
the at least one second extending portion includes a plurality of second extending portions extending leftward and rightward from the cooling section body, and
the plurality of the second extending portions are arranged such that when two cooling sections are arranged to the left and right of each other and one of the cooling sections is rotated by 180° with respect to the other cooling section in the same plane, the second extending portion of the one cooling section and the second extending portion of the other cooling section do not interfere with each other.

According to (10), even if the cooling sections having the same configuration are disposed to the left and right of each other, interference between the second extending portions of the cooling sections is prevented, so that it is possible to arrange the two cooling sections close to each other.

What is claimed is:

1. A heating element cooling mechanism comprising:
a heating element;
a support section that supports the heating element; and
a cooling section configured to perform heat exchange with the heating element, wherein
the heating element is supported by the support section in direct contact,
the cooling section is supported by the support section by biasing,
a heat transfer member is disposed between the heating element and the cooling section, and the heating element and the cooling section are not in direct contact with each other,
the support section includes a first extending portion including a first extension end extending in a direction parallel to a biasing direction for biasing the cooling section,
the cooling section includes at least one second extending portion including a second extension end extending in a direction parallel to the biasing direction,
the first extension end and the second extension end are connected to each other,
the support section includes:
a shelf that supports the heating element, and
the first extending portion extending from the shelf,
the support section supports the cooling section via a buffer member, and
the buffer member is disposed between the shelf and the first extending portion.

2. The heating element cooling mechanism according to claim 1, wherein
the support section supports the cooling section via a buffer member.

3. The heating element cooling mechanism according to claim 1, wherein
the first extending portion and the second extending portion respectively include:
a first extension base and a second extension base extending in directions toward each other;
the first extension end and the second extension end extending in a direction away from the cooling section in the biasing direction; and
a first bent portion connecting the first extension base and the first extension end, and a second bent portion connecting the second extension base and the second extension end.

4. The heating element cooling mechanism according to claim 1, wherein
the shelf is provided with a rod-shaped member extending in the biasing direction, and the first extending portion is attached to the rod-shaped member via the buffer member.

5. The heating element cooling mechanism according to claim 1, wherein
the support section has a lower thermal conductivity than that of the cooling section.

6. The heating element cooling mechanism according to claim 1, wherein
the cooling section is a liquid cooling device configured to cool the heating element via a liquid medium.

7. The heating element cooling mechanism according to claim 1, wherein
the support section includes at least two stages of shelves in an upper-lower direction,
the heating element includes a first heating element supported by a shelf of an upper stage among the two stages of shelves and a second heating element supported by a shelf of a lower stage, and
a heat generation amount of the first heating element is smaller than a heat generation amount of the second heating element.

8. The heating element cooling mechanism according to claim 1, wherein
the cooling section includes a cooling section body,
the at least one second extending portion includes a plurality of second extending portions extending leftward and rightward from the cooling section body, and
the plurality of the second extending portions are arranged such that when two cooling sections are arranged to the left and right of each other and one of the cooling sections is rotated by 180° with respect to the other cooling section in the same plane, the second extending portion of the one cooling section and the second extending portion of the other cooling section do not interfere with each other.

9. A heating element cooling mechanism comprising:
a heating element;
a support section that supports the heating element; and
a cooling section configured to perform heat exchange with the heating element, wherein
the heating element is supported by the support section in direct contact,
the cooling section is supported by the support section by biasing,
a heat transfer member is disposed between the heating element and the cooling section, and the heating element and the cooling section are not in direct contact with each other,
the support section includes a first extending portion including a first extension end extending in a direction parallel to a biasing direction for biasing the cooling section,
the cooling section includes at least one second extending portion including a second extension end extending in a direction parallel to the biasing direction,
the first extension end and the second extension end are connected to each other,
the cooling section includes a cooling section body,
the at least one second extending portion includes a plurality of second extending portions extending leftward and rightward from the cooling section body, and
the plurality of the second extending portions are arranged such that when two cooling sections are arranged to the left and right of each other and one of the cooling sections is rotated by 180° with respect to the other cooling section in the same plane, the second extending portion of the one cooling section and the second extending portion of the other cooling section do not interfere with each other.

10. The heating element cooling mechanism according to claim 9, wherein
the support section supports the cooling section via a buffer member.

11. The heating element cooling mechanism according to claim 9, wherein
the first extending portion and the second extending portion respectively include:
a first extension base and a second extension base extending in directions toward each other;
the first extension end and the second extension end extending in a direction away from the cooling section in the biasing direction; and
a first bent portion connecting the first extension base and the first extension end, and a second bent portion connecting the second extension base and the second extension end.

12. The heating element cooling mechanism according to claim 9, wherein
the support section includes:
a shelf that supports the heating element, and
the first extending portion extending from the shelf, and supports the cooling section via a buffer member, and
the buffer member is disposed between the shelf and the first extending portion.

13. The heating element cooling mechanism according to claim 9, wherein
the shelf is provided with a rod-shaped member extending in the biasing direction, and
the first extending portion is attached to the rod-shaped member via the buffer member.

14. The heating element cooling mechanism according to claim 9, wherein
the support section has a lower thermal conductivity than that of the cooling section.

15. The heating element cooling mechanism according to claim 9, wherein
the cooling section is a liquid cooling device configured to cool the heating element via a liquid medium.

16. The heating element cooling mechanism according to claim 9, wherein
the support section includes at least two stages of shelves in an upper-lower direction,
the heating element includes a first heating element supported by a shelf of an upper stage among the two stages of shelves and a second heating element supported by a shelf of a lower stage, and
a heat generation amount of the first heating element is smaller than a heat generation amount of the second heating element.

* * * * *